United States Patent
Clark et al.

(10) Patent No.: US 6,404,366 B1
(45) Date of Patent: Jun. 11, 2002

(54) PHOTONIC ANALOG-TO-DIGITAL CONVERTER UTILIZING WAVELENGTH DIVISION MULTIPLEXING AND DISTRIBUTED OPTICAL PHASE MODULATION

(75) Inventors: Thomas Clark, Columbia, MD (US); Paul Matthews, Springfield, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/726,616

(22) Filed: Dec. 1, 2000

(51) Int. Cl.$^7$ ................................................. H03M 1/00
(52) U.S. Cl. ........................................ 341/137; 359/122
(58) Field of Search ................................ 341/137, 155, 341/141, 111; 359/124, 122, 123, 113, 188, 189

(56) References Cited

U.S. PATENT DOCUMENTS

| | | | |
|---|---|---|---|
| 4,058,722 A | 11/1977 | Taylor | 250/255 |
| 4,325,603 A | 4/1982 | Maron | 350/96.14 |
| 4,502,037 A | 2/1985 | Le Parquier et al. | 341/137 |
| H353 H | 10/1987 | Taylor | 341/137 |
| 4,947,170 A | 8/1990 | Falk | 341/137 |
| 4,991,920 A | 2/1991 | Peczalski | 350/96.4 |
| 5,010,346 A | 4/1991 | Hamilton et al. | 341/137 |
| 5,011,925 A * | 4/1991 | Krishnan et al. | 374/126 |
| 5,307,063 A | 4/1994 | Kratz et al. | 341/133 |
| 5,949,925 A * | 9/1999 | Seino | 385/1 |
| 6,064,325 A | 5/2000 | Fields et al. | 341/137 |
| 6,100,831 A | 8/2000 | Frankel | 341/137 |
| 6,118,396 A | 9/2000 | Song | 341/137 |
| 6,118,397 A | 9/2000 | Heflinger | 341/137 |
| 6,151,428 A * | 11/2000 | Vahala et al. | 385/11 |

* cited by examiner

*Primary Examiner*—Peguy JeanPierre
(74) *Attorney, Agent, or Firm*—John J. Karasek; L. George Legg (57) ABSTRACT

A new pipeline method and apparatus for photonic analog-to-digital converters (ADCs) utilizing wavelength division multiplexing (WDM) and distributed phase modulation is disclosed. The analog-to-digital conversion is performed within the optical system of the ADC, and thus the optical output is a digital bit pattern. The optical output of this system thus facilitates ADC conversion at much higher speeds than available with conventional electronic ADCs. Phase modulators and polarization-based optics are used to map an input analog waveform into a binary output.

30 Claims, 4 Drawing Sheets

PHOTONIC ANALOG-TO-DIGITAL CONVERTER UTILIZING WAVELENGTH DIVISION MULTIPLEXING AND DISTRIBUTED OPTICAL PHASE MODULATION

BACKGROUND OF THE INVENTION

1. Technical Field of the Invention

The present invention generally relates to analog to digital converters (ADC). More particularly, it relates to photonic analog-to-digital converters using a new pipeline scheme utilizing wavelength division multiplexing and distributed phase modulation. The present invention performs analog-to-digital conversion within the optical system, and thus produces a binary optical output in the form of a digital bit pattern.

2. Description of Related Art

It is often desirable to convert an analog amplitude varying signal to a digital set of values which correspond to various voltages in the analog waveform to generate a corresponding digital signal. Conventional approaches rely on iterative or comparative techniques for determining a digital signal based on an analog waveform voltage. Further, transformation of wideband data signals from the analog-to-digital domain may require sample rates that are generally not available in pure electronic analog-to-digital converters. Using currently available technology, electronic ADCs are limited to about 2 gigasamples/second. Ideally, the sample rate of a suitable ADC should be from 2.5 to 4 times the maximum bandwidth of the analog signal digitized.

Presently, the fastest commercially available ADCs are flash converters, which comprise of a sample and hold circuit and a digitizer circuit. By using multiplexing or interlveaving techniques, the sample rate of such electronic Analog-to-Digital (A–D) systems maybe extended to about two gigasamples/second at about 6-bits of resolution. Some ADCs architectures involved interleaving parallel channels of sampling and comparing circuits, thereby increasing their effective speed by the number of parallel channels.

Recognizing the limitations on bandwidth, sampling rate, and resolution of electronic ADCs, focus of the prior art shifted to optical devices to substantially improve upon these parameters resulting in electronic ADCs evolving in several different architectures. Photonic systems, with their large bandwidths and low-noise operation, may be directly substituted for their electronic counterparts, thus improving the integrated system and thereby extending the overall performance.

Although the concept of photonic ADC is relatively old, most of the current photonic ADCs involve techniques that use mode-locked lasers to provide picosecond and sub-picosecond sampling of the electronic waveform in an electro-optic device, such as an electro-optic modulator (EOM). These systems operate by using photonic sampling as a high-speed, photonic sample-and-hold circuit, or as a pre-sampler for an electronic sample-and-hold circuit, thus enhancing the performance of the final-stage electronic ADC which performs the digitization of the signal.

To further enhance the speed of the entire electronic and photonic system, the photonic system samples the waveform at a much higher speed, and then divides or demultiplexes the output onto several channels that operate at the speed of the electronic ADCs. The electronic output data is then interleaved to provide an effective sampling rate that is higher than the rate that could be achieved with a single electronic ADC. The capability of the photonic system to operate at very high sampling rates arises from the mode-locked laser sources that have extremely precise timing capable of serving as an optical clock. While the prior art teaches improving the speed of the ADCs, it fails to teach or suggest a pipeline or a series scheme for photonic ADCs utilizing wavelength division multiplexing (WDM) and distributed phase modulation.

In U.S. Pat. No. 5,010,346 to Hamilton et al., an electro-optical A–D converter is disclosed which uses a series of separate lasers having different wavelengths as an optical carrier. It will be appreciated that it would be difficult to synchronize the timing and amplitude of these laser beams, and that the resulting jitter between the channels limits the sampling rate and amplitude resolution. Moreover, the number of channels such an electro-optical A-D converter can use appears to be limited to about ten.

In U.S. Pat. No. 4,502,037 to Le Parquier et al. discloses an A–D converter that includes an optical modulator which includes one interferometer channel for each bit of a digital output word is disclosed. The output word corresponds to the magnitude of an analog input signal. The modulator applies a phase shift to each channel used to modulate light from a laser source, and the modulated light is demodulated by an array of photodetectors and comparators to produce a corresponding digital signal.

In U.S. Statutory Invention Registration H353 an optical converter with expanded dynamic range is disclosed. The expanded dynamic range is achieved by dividing the input signal into an optically modulated light pulse signal comprising least significant bits (LSB) and most significant bits (MSB) representations. The LSB and MSB representations are then interleaved to form a final binary representation of the input analog signal. In this system, each of the parallel optical channels are created with electro-optic modulators, and these modulators are driven in parallel by an input analog signal.

Based on the foregoing, it should be appreciated that there has arisen a need for an apparatus and method for converting an analog signal into a digital signal by using a new pipeline scheme utilizing wavelength division multiplexing and distributed phase modulation, and thus removing the complexity of channel timing and synchronization of the time-interleaved photonic ADCs. Furthermore, the digital output of the analog-to-digital converter system may be beneficial since it allows direct optical data transfer through transmission media in telecommunication systems.

SUMMARY OF THE INVENTION

Accordingly, the present invention is directed to an innovative solution which provides for the conversion of analog signals to digital signals using a series of electro-optic modulators (EOMs). The present invention adopts wavelength division multiplexing and distributed phase modulation techniques to perform analog-to-digital conversion of an input signal, wherein analog-to-digital conversion is performed within the optical system of the analog-to-digital converter. In the preferred embodiment of the present invention, the EOMs are essentially electro-optic phase modulators (EOPMs) used to change/modify the phase/polarization of an optical signal.

In one aspect, the present invention is directed to a photonic analog-to-digital converter (ADC) system which includes a multiwavelength optical source capable of producing signals of different wavelengths, and at least one polarizer in order to set a polarization state within the photonic analog-to-digital converter system. A plurality of electro-optic modulators are arranged in series wherein each of the electro-optic modulators (EOMs) perform signal processing to produce an optical output having a modified polarization state. A plurality of wavelength filters are arranged in series to probe an optical phase change, wherein each of the wavelength filters extracts an optical signal of a specified wavelength. A plurality of polarization controllers set an optical bias within the ADC system. The ADC system further includes a plurality of analyzers for analyzing polarization states to create an optical transfer function, wherein each analyzer analyzes the polarization state of a respective EOM.

In one exemplary embodiment of the present invention, the wavelength filter is comprised of a wavelength division multiplexer (WDM). In another exemplary embodiment, each analyzer is comprised of a polarization maintaining optical isolator. In yet another exemplary embodiment, each of the wavelength filters is comprised of a beamsplitter to filter optical signals of a specified wavelength. It is to be noted that a single wavelength source, instead of a multi-wavelength source, may be used in the embodiment where a beamsplitter is employed to filter optical signals.

In another aspect, the present is directed to a method of converting analog signals to digital signals in a photonic analog-to-digital converter system comprising at least one polarizer, a plurality of electro-optic modulators arranged in series, and a plurality of wavelength filters to probe an optical phase change. First, a plurality optical signals of differing wavelengths are produced using a multiwavelength optical source. These multiwavelength signals are passed through a polarizer in order to set an initial polarization state in the ADC system. The polarized optical signals are passed through an electro-optic modulator which modifies the polarization states of the optical signals, thus resulting in an optical signal with modified polarization states. The modified optical signal is then passed through a wavelength filter, disposed in between a plurality of electro-optic modulators, in order to extract an optical signal of a specified wavelength.

The extracted optical signal is subsequently processed whereby a change in polarization is converted to a change in optical intensity to produce an individual binary optical output representing a most significant bit in the digitized representation of the analog signal. The unextracted optical signals are passed through a second electrooptic modulator to produce a modified optical signal, and the modified optical signal is passed through a second wavelength filter to extract an optical signal of another specified wavelength. The extracted signal is likewise processed to produce an individual binary optical output. The above method continues until signals of all the wavelengths are extracted and processed resulting in binary optical outputs. The combination of all the binary optical outputs produces a digital equivalent value of the analog signal.

In yet another aspect of the invention, the present invention is directed to a photonic analog-to-digital converter (ADC) integrated into a single electro-optic crystal. The photonic ADC system integrated into a single electro-optic crystal includes a at least one polarizer for setting the polaization state within the photonic ADC system, at least one analyzer to perform signal processing to produce a polarization signal having a modified polarization state. Optical signal processing components, such as wavelength filters, etc., are also disposed at regular intervals in the single crystal in order to filter optical signals of specified wavelengths.

The wavelength filters may be used to probe an optical phase change with each of the wavelength filter extracting an optical signal of a specified wavelength. A plurality of polarization controllers are also provided in the single electro-optic crystal to set an optical bias within the ADC system. The photonic ADC system further includes at least one analyzer for analyzing polarization states to create an optical transfer function by analyzing the polarization state of a respective electro-optic modulator.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
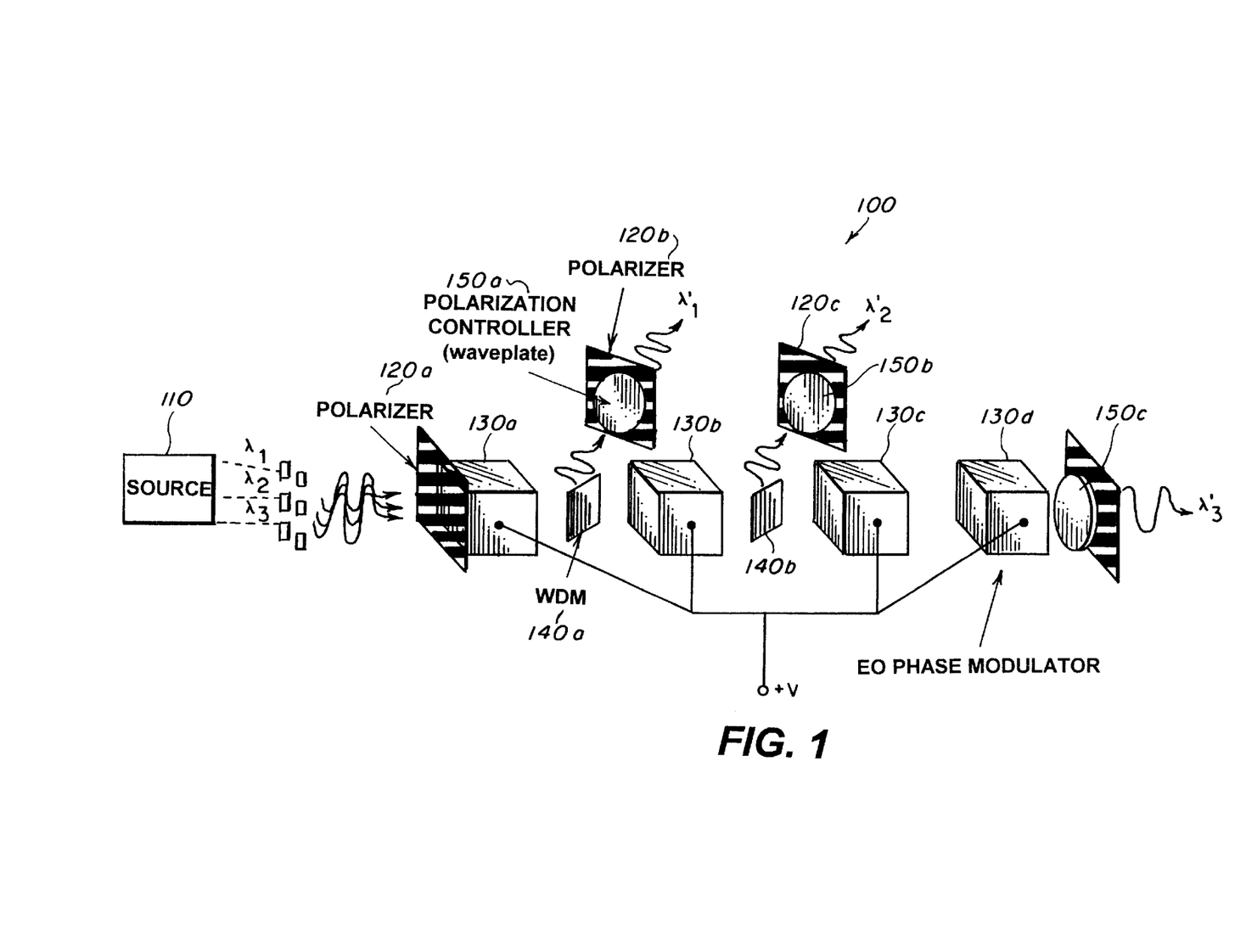
FIG. 1 illustrates a conceptual diagram of an analog-to-digital converter (ADC) using wavelength division multiplexer (WDM) and employing distributed phase modulation.

In the drawings, like or similar elements are designated with identical reference numerals through the drawings, and the various elements depicted are not necessarily drawn to scale. Referring now to FIG. 1, there is shown a general conceptual diagram of a photonic analog-to-digital converter (ADC) employing wavelength division multiplexing and distributed phase modulation.

As illustrated in a presently preferred exemplary embodiment of the photonic ADC system 100 as in FIG. 1, the photonic ADC system includes a multiwavelength source 110 for generating an optical signal of multiple wavelengths. At least one polarizer 120a is provided in order to set the polarization within the photonic ADC system. A plurality of electro-optic modulators 130a–130d are provided in order to modify the polarization state by modulating the phase of the optical signal by means of analog input voltage (+V) applied to each of the electro-optic modulators. A wavelength filter 140a is preferably disposed in between electro-optic modulators 130a and 130b, while a second wavelength filter 140b is disposed in between electro-optic modulators 130b and 130c. Each of the wavelength filters 140a and 140b may be implemented using a wavelength division multiplexer which separates the modulated optical signal into a series of channels based on wavelength bands.

Further, a plurality of analyzers 120b, 120c, and 120d are provided to analyze the polarization state of an optical signal and also to convert the optical change in polarization to a change in optical intensity. A plurality of polarization controllers 150a–150c to set the optical bias within the photonic ADC system 100. It is to be understood that FIG. 1 is merely an illustrative example to explain the operation of the photonic ADC of the present invention. It should, however, not be construed as a limiting example of the present invention. Therefore, depending on the number of wavelengths comprised in an optical signal, the components used in the photonic ADC to process the optical signal may be vary. In fact, the components involved in processing the analog electrical signal may also vary depending upon the intended resolution of the photonic ADC. Thus, the number of polarizers, analyzers, EOMs, wavelength filters, etc. may all be varied depending on the number of wavelengths involved and the resolution that is intended to achieve of the ADC.

Against the above description of FIG. 1, the operation of the photonic ADC system may be better understood. Continuing to refer to FIG. 1, a multiwavelength source 110 produces an optical signal of multiple wavelengths, for example ($\lambda_{1-3}$). The generated signals are passed through a polarizer 120a in order to set the initial polarization in the photonic ADC system 100. The optical signal is then passed through a first electro-optic modulator (EOM) 130a, whereby the polarization state of the optical signal is modified by an analog electrical signal (+V) applied to the EOM 120a. The modified optical signal is then made to pass through a wavelength division multiplexer 140a which separates wavelengths by filtering light of a specified wavelength ($\lambda_1$) from the multiple wavelength optical signal.

In order to set an optical bias, the filtered light having wavelength $\lambda_1$ is now passed through a polarization controller or waveplate 150a and subsequently passed through an analyzer 120b to analyze the respective polarization state. Analyzer 120b is used to convert the change in polarization to a change in optical intensity. The optical output $\lambda_1$' outputted after passing through analyzer 120b is now a digital representation of the most significant bit (MSB) of the applied analog electric signal (+V). In one exemplary embodiment, Analyzer 120b may be a polarization maintaining optical isolator.

Continuing to refer to FIG. 1, further to filtering $\lambda_1$ using WDM 140a, the unfiltered light having wavelengths ($\lambda_{2-3}$) is now made to pass through a second EOM 130b and subsequent EOMs 130c and 130d whereby the unfiltered light ($\lambda_{2-3}$) is interrogated in a fashion similar to filtering $\lambda_1$ to produce individual binary optical outputs $\lambda_2$' and $\lambda_3$' as illustrated in FIG. 1. The combination of $\lambda_1$', $\lambda_2$', and $\lambda_3$' represents the digital equivalent value of the applied analog electrical signal (+V) to each of the EOMs of the photonic ADC system.

Unlike prior art photonic ADC systems that use parallel channels to process the data, the photonic ADC system of the present invention accumulates more phase retardation as it travels along a single path. As illustrated in FIG. 1, $\lambda_2$ and $\lambda_3$ travel through more electro-optic modulators when compared to $\lambda_1$, thereby receiving more phase change than $\lambda_1$ which is shown to travel through only one electro-optic modulator 130a. Thus, by exploiting the non-linear function of an electro-optic modulator, the photonic ADC system of the present invention provides the analog signal processing necessary to produce a digital waveform as an optical output.

In one embodiment, the final stage of the photonic ADC system 100 thresholds the data at its mid-scale amplitude, either by optical bistable devices, or by means of electronic comparators, in order to produce high contrast (on/off or one/zero) output. Once the data is transferred into electronic domain, clocking is performed by electronic readout systems (not shown here), thereby relieving any clock or synchronization difficulties between electrical and optical systems. One skilled in the art would appreciate that the presence or absence of this final stage has no effect on the basic functioning of the photonic ADC of the present invention.

Figure 2:
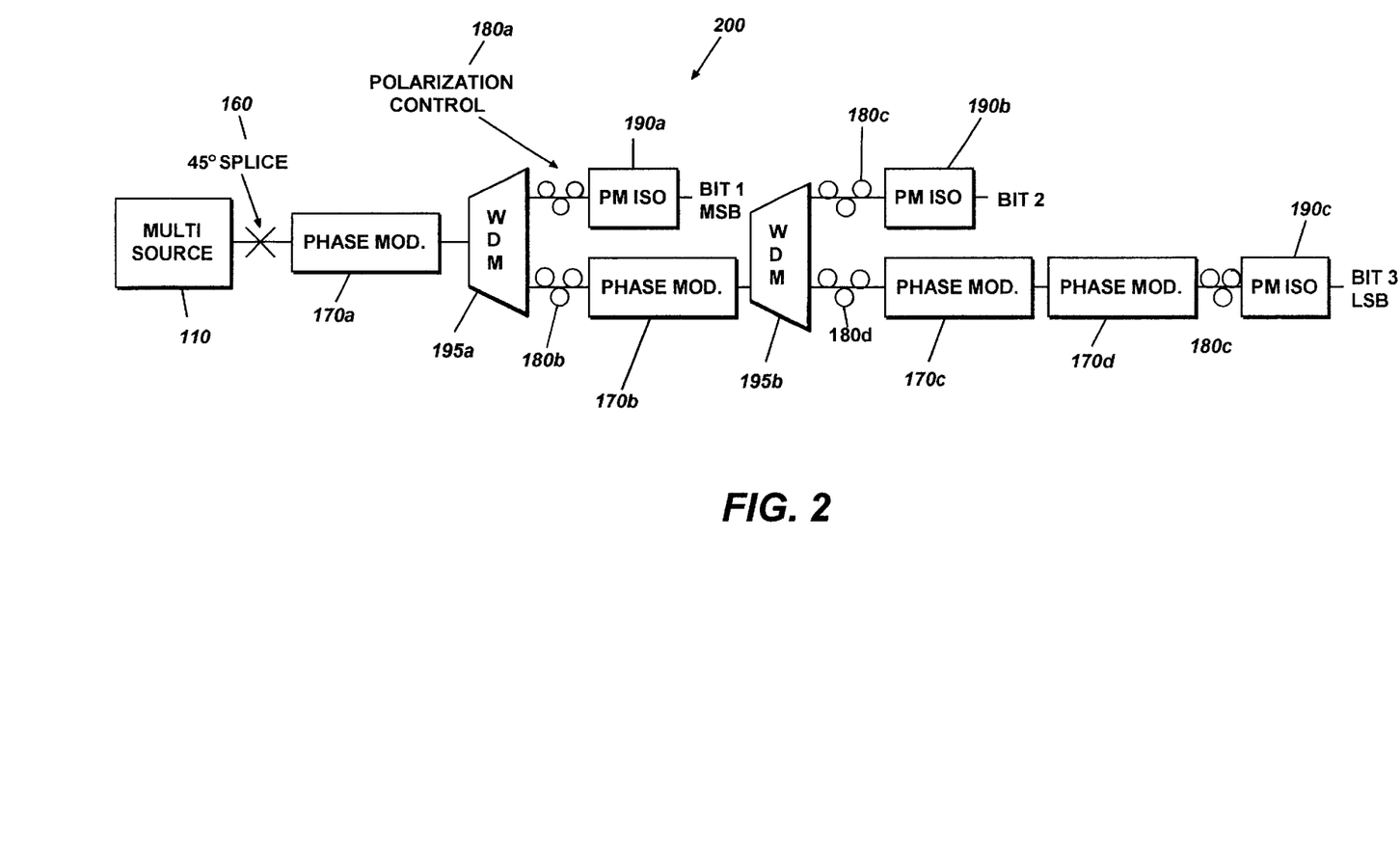
FIG. 2 illustrates the implementation of a 3-bit photonic ADC employing distributed phase modulation using discrete fiber optic devices.

Those skilled in the art should appreciate that the depiction of the photonic ADC system 100 is a somewhat simplified view of a photonic ADC system that may be provided in actual practice of the present invention. Numerous additional components may be contained within the photonic ADC system, with various arrangements of filtering and processing optical signals. Moreover, the organization of the photonic ADC system may differ from that depicted in FIG. 1, which is, accordingly, intended to be merely illustrative and not limiting of the present invention. FIG. 2 illustrates a 3-bit photonic ADC system of FIG. 1 implemented using fiber optic devices.

Figure 3:
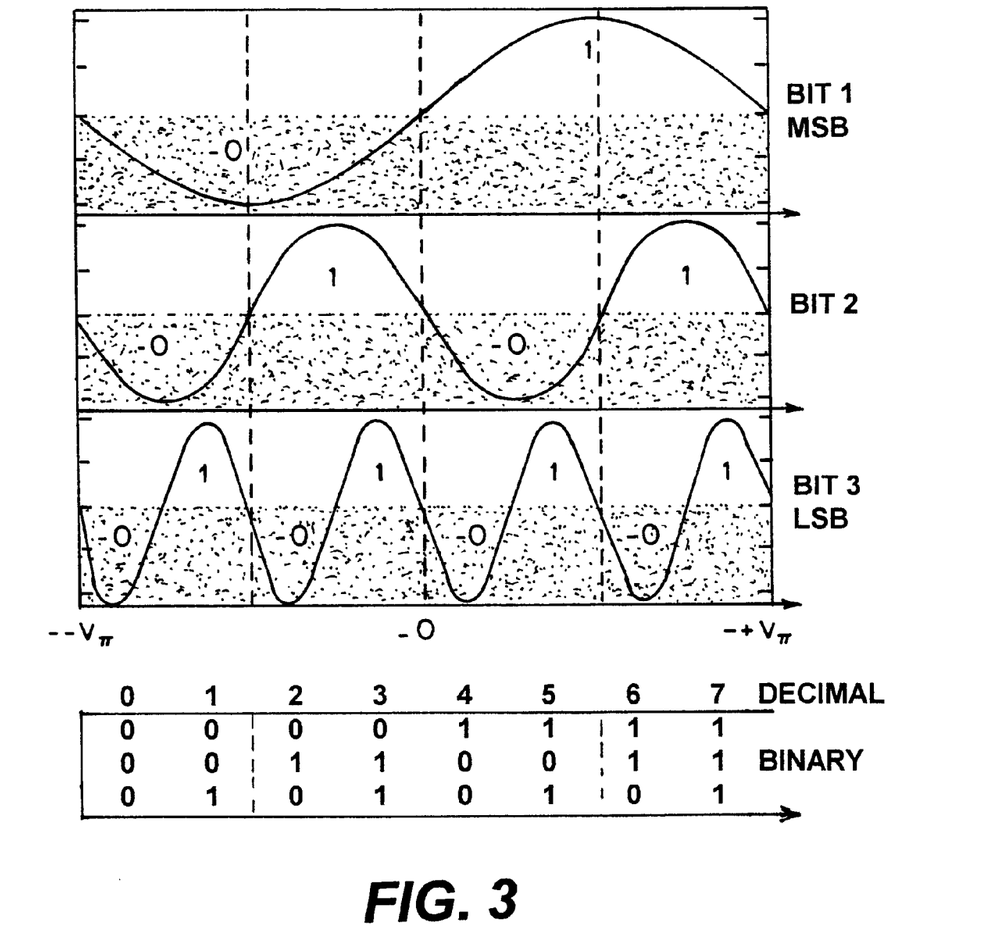
FIG. 3 illustrates a transfer function mapping the input signal voltage to digital optical output for a 3-bit photonic ADC system.

Referring now to FIG. 3, there is shown a transfer function mapping the analog input signal voltage to digital optical output for a 3-bit photonic ADC system of FIG. 2. The intensity of three optical outputs ($\lambda_1$, $\lambda_2$, and $\lambda_3$), as illustrated in FIG. 1, are plotted with respect to the analog input signal voltage. The nonlinear optical output intensity, obtained by the electro-optic modulation of the optical phase between polarizers 120a, 120b, 120c, and 120d provides the transfer function to convert from analog electrical input signal to individual binary outputs. The polarization controllers or waveplates 150a, 150b, and 150c, as shown in FIG. 1, allow for optically biasing the photonic ADC system 100 to align the zeroes of individual curves in the transfer function as illustrated in FIG. 3. Assuming that a bit value of "0" is assigned to values below mid-scale and "1" to values above mid-scale on the y-axis, FIG. 3 illustrates an increasing binary output with increasing analog input signal voltage. Thus, the photonic ADC system creates a transfer function that produces the binary optical output as illustrated in FIG. 3.

The resolution of the photonic ADC system 100 may be increased by increasing the number of output bits. Thus, each new least-significant-bit (LSB) is provided with an additional optical phase change which may be equal to the total phase change of a former LSB. For N bits, a total of $2^{(N-1)}$ electro-optic modulators with an equal analog input voltage applied to all the modulators may be used. The resolution may also be expressed as a product of the analog electrical input voltage times the interaction length of each of the EOMs. Adding an additional bit of resolution may be achieved by applying an equal voltage to an equal number of EOMs. Increased resolution may also be achieved by decreasing the number of additional EOMs while amplifying the analog electrical input voltage applied to each EOM.

Figure 4:
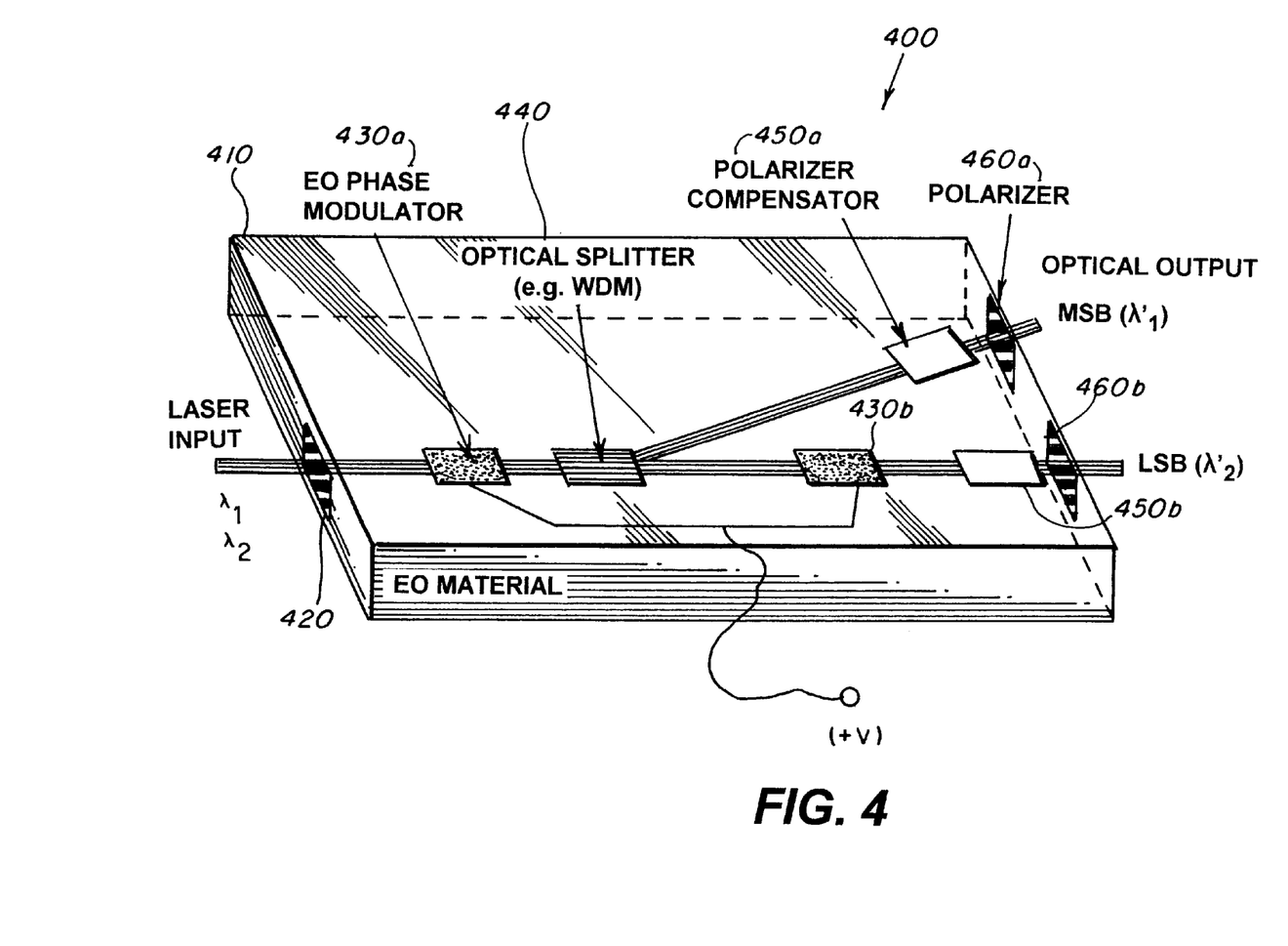
FIG. 4 illustrates the integration of a distributed phase modulated, photonic ADC onto a single piece of electro-optic material, providing a monolithic photonic ADC with inputs for the analog electrical input signal, laser input, and digital optical outputs.

FIG. 4 illustrates an alternate embodiment of the present invention. The photonic ADC system of FIG. 1 may be integrated into a single electro-optic crystal aS illustrated in FIG. 4. Referring now to FIG. 4, numeral 400 depicts an integrated photonic ADC system with distributed phase modulation. An entire photonic ADC system may be integrated into a single electro-optic crystal 410. Each of the components for processing signals in the photonic ADC system 400 are made in the electro-optic crystal 410. Various techniques such as etching or deposition or other alternate methods may be used to make the several components in the electro-optic crystal 410. The functioning of the photonic ADC 400 and each of the components within the photonic ADC system may be similar to the functioning of the photonic ADC system and its components as discussed with respect to FIG. 1. FIG. 4 illustrates the operation of a 2-bit photonic ADC system. It is to be understood that this illustration is shown as a non-limiting example of the present invention in order to more clearly explain the present invention.

The pipeline or series nature of the photonic ADC system of the present invention relieves the present system of internal clocking and synchronization difficulties faced by the prior art. Thus, continuous-wave lasers may be used to drive the photonic ADC system, thereby reducing the size and cost of the final system.

Alternately, a mode-locked laser may also be used to enhance the photonic ADC system of the present invention by providing a stable, low-noise clock for the internal components of the photonic ADC system 400. The precise timing of a mode-locked laser may also be used for timing control of the components of the photonic ADC system 400 in order to achieve further higher speeds.

It is believed that the operation and construction of the present invention will be apparent from the foregoing Detailed Description. While the apparatus and method shown and described have been characterized as being preferred, it should be readily understood that various changes, modifications and enhancements could be made therein without departing from the scope of the present invention as set forth in the following claims. For example, it is possible to use a variable number of EOMs depending upon the number of wavelengths involved and the resolution that is intended to be achieved. It is further possible to use a single electro-optic crystal instead of using a plurality of electro-optic crystals. Accordingly, those skilled in the art should appreciate that these and other variations, additions, modifications, enhancements, et cetera, are deemed to be within the ambit of the present invention whose scope is determined solely by the following claims.

What is claimed is:

1. A photonic analog-to-digital converter, comprising:
   optical source capable of producing signals of differing wavelengths;
   at least one polarizer for setting a polarization state;
   a plurality of electro-optic modulators arranged in series, wherein each of said plurality of electro-optic modulators performs signal processing to produce an optical output having a modified polarization state;
   a plurality of wavelength filters arranged in series to probe an optical phase change, each of said wavelength filters extracting a signal having a specified wavelength;
   at least one polarization controller to set an optical bias; and
   at least one analyzer for analyzing polarization state of said extracted signal to create a transfer function.

2. The photonic analog-to-digital converter of claim 1, wherein said analyzer is a polarization maintaining optical isolator.

3. The analog-to-digital converter of claim 1, wherein said wavelength filter is a Wavelength-Division-Multiplexer (WDM).

4. The analog-to-digital converter of claim 1, wherein each of said electro-optic modulators have a non-linear transfer function.

5. The analog-to-digital converter of claim 1, wherein each of said EOMs is an electro-optic phase modulator (EOPM).

6. The analog-to-digital converter of claim 1, wherein said optical source is a continuous wave (CW) laser.

7. The analog-to-digital converter of claim 1, wherein said optical source is a mode-locked laser.

8. The analog-to-digital converter of claim 1, wherein said optical source is a single wavelength optical source.

9. The analog-to-digital converter of claim 8, wherein said wavelength filter is a beamsplitter.

10. A photonic analog-to-digital converter made in a single electro-optic crystal, comprising:
    an optical source;
    a plurality of electro-optic modulators made in said single electro-optic crystal, said electro-optic crystal further comprising:
      at least one polarizer to set a polarization state;
      a plurality of wavelength filters for extracting optical signals to probe an optical phase change, said filters provided at definite intervals along the length of said electro-optic crystal;
      at least one polarization controller to set an optical bias; and
      at least one analyzer for analyzing polarization state of said extracted light to create a transfer function.

11. The photonic analog-to-digital converter of claim 10, wherein said analyzer is a polarization maintaining optical isolator.

12. The photonic analog-to-digital converter of claim 10, wherein said wavelength filter is a Wavelength-Division-Multiplexer (WDM).

13. The photonic analog-to-digital converter of claim 10, wherein each of said electro-optic modulators have a non-linear transfer function.

14. The photonic analog-to-digital converter of claim 10, wherein each of said electro-optic modulators is an electro-optic phase modulator (EOPM).

15. The photonic analog-to-digital converter of claim 10, wherein said optical source is a continuous wave (CW) laser.

16. The photonic analog-to-digital converter of claim 10, wherein said optical source is a mode-locked laser.

17. In a photonic electro-optic analog-to-digital converter system comprising a at least one polarizer, at least one analyzer, a plurality of electro-optic modulators arranged in series, at least one wavelength filter to probe an optical phase change, a method of converting an analog signal to a digital signal comprises the steps of:
    (a) producing a plurality of optical signals of differing wavelengths using a multiwavelength source;
    (b) passing said plurality of optical signals through a polarizer in order to set an initial polarization in said analog-to-digital converter system;
    (c) modifying respective polarization states of each said optical signals by each of a plurality of electro-optic modulators;
    (d) extracting an optical signal having a specified wavelength, from said optical signals with modified polarization states, using a wavelength filter, wherein said wavelength filter is disposed between a pair of said electro-optic modulators;
    (e) passing unextracted optical signals through another of said electro-optic modulator and wavelength filter arranged in series in order to modulate and filter an optical signal of a different wavelength among said optical signals;
    (f) processing said extracted signal of step(d), whereby a change in polarization is converted to a change in optical intensity to produce an individual binary optical output;
    (g) repeating step (e) until all the wavelengths in said optical signal are extracted and processed to produce individual binary optical outputs; and
    (h) combining the binary outputs of step(f) and step(g) to produce a digital equivalent value of said analog signal.

18. The method of claim 17, wherein said analyzer is an optical isolator.

19. The method of claim 17, wherein said wavelength filter is a wavelength division multiplexer.

20. The method of claim 17, wherein each of said electro-optic modulators is an electro-optic phase modulator (EOPM).

21. The method of claim 17, wherein said multiwavelength source is a continuous wave (CW) laser.

22. The method of claim 17, wherein said multiwavelength source is a mode-locked laser.

23. A method of converting analog signals to digital signals in an electro-optic analog-to-digital converter system comprising a plurality of electro-optic modulators (EOMs) arranged in series, the method comprising the steps of:

(a) producing a plurality of optical signals of differing wavelengths using a multiwavelength optical source;

(b) modulating said optical signals by an EOM, from among said plurality of EOMs, closest to said source, and filtering an optical signal of a specified wavelength by means of a wavelength filter;

(c) processing the filtered signal of step(b) to produce a digital signal representing a most significant bit of said analog signal;

(d) passing the unfiltered light from step (b) through another EOM which is next in series among said plurality of EOMs; and (e) subsequently repeating step (b) and step (c) at each of the remaining plurality of EOMs to produce individual binary optical outputs.

24. The method of claim 23, wherein filtering of optical signals is performed using a wavelength-division-multiplexer (WDM).

25. The method of claim 23, wherein the step of processing the filtered signal comprises passing the filtered signal through a polarization controller in order to set an optical bias.

26. The method of claim 25, wherein filtered signal is firther passed through another polarizer for analyzing the polarization state and converting the change in polarization to a change in optical intensity.

27. A method of converting analog signals to digital signals in an electro-optic analog-to-digital converter system comprising a plurality of electro-optic modulators arranged in series, the method comprising the steps of:

(a) successively modulating and extracting optical signals of specified wavelengths at each of said plurality of EOMs; and (b) processing said extracted signals by converting a change polarization to a change in optical intensity, the optical signal at each of said successive EOMs representing an individual binary optical output of said analog signal.

28. The method of claim 27, wherein each of said electro-optic modulators are electro-optic phase modulators.

29. A photonic analog-to-digital converter (ADC) system, comprising:

means for producing optical signals of different wavelengths;

means for setting the polarization state within said ADC system;

a plurality of electro-optic modulators for performing signal processing to modify the polarization states of optical signals;

means for extracting optical signals of specific wavelengths from said optical signals;

means for setting optical bias within said ADC system; and means for analyzing the polarization states to create an optical transfer function.

30. The photonic analog-to-digital converter of claim 29, wherein each of said electro-optic modulators are electro-optic phase modulators.

* * * * *

UNITED STATES PATENT AND TRADEMARK OFFICE
CERTIFICATE OF CORRECTION

PATENT NO. : 6,404,366 B1
DATED : June 11, 2002
INVENTOR(S) : Thomas Clark, Paul Matthews and Marc Currie It is certified that error appears in the above-identified patent and that said Letters Patent is hereby corrected as shown below:

<u>Title page,</u>
Item [75], Inventors, after Springfield, VA (US) add --; Marc Currie, Alexandria, VA (US) --.

Signed and Sealed this

Fifteenth Day of October, 2002

*Attest:*

*Attesting Officer*

JAMES E. ROGAN
*Director of the United States Patent and Trademark Office*